(12) United States Patent
Merkle et al.

(10) Patent No.: US 9,848,500 B2
(45) Date of Patent: Dec. 19, 2017

(54) METHOD OF MANUFACTURING A PACKAGE FOR EMBEDDING ONE OR MORE ELECTRONIC COMPONENTS

(71) Applicant: SONY CORPORATION, Tokyo (JP)

(72) Inventors: Thomas Merkle, Stuttgart (DE); Stefan Koch, Oppenweiler (DE); Joo-Young Choi, Fellbach (DE)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/186,022

(22) Filed: Jun. 17, 2016

(65) Prior Publication Data

US 2016/0366770 A1 Dec. 15, 2016

Related U.S. Application Data

(63) Continuation of application No. 13/348,295, filed on Jan. 11, 2012, now Pat. No. 9,398,694.

(30) Foreign Application Priority Data

Jan. 18, 2011 (EP) ..................................... 11151208

(51) Int. Cl.
*H01L 25/00* (2006.01)
*H05K 3/46* (2006.01)
(Continued)

(52) U.S. Cl.
CPC ..... *H05K 3/4697* (2013.01); *H01L 23/49827* (2013.01); *H01L 23/5389* (2013.01);
(Continued)

(58) Field of Classification Search
CPC ..... H01L 25/16; H01L 23/66; H01L 23/5389; H05K 1/0243; H05K 1/185
See application file for complete search history.

(56) References Cited

U.S. PATENT DOCUMENTS 5,030,935 A 7/1991 Williams et al.
5,049,978 A 9/1991 Bates et al.
(Continued)

FOREIGN PATENT DOCUMENTS

CN 1964618 A 5/2007
EP 1 204 301 A2 5/2002
(Continued)

OTHER PUBLICATIONS

Michael S. Adler, et al., "Multi-Chip Modules for Analog and Microwave: dc to 18GHz", IEEE International Solid-State Circuits Conference (ISSCC), Session 11, Feb. 25, 1993, pp. 170-171, 285.
(Continued)

*Primary Examiner* — Ermias Woldegeorgis
(74) *Attorney, Agent, or Firm* — Oblon, McClelland, Maier & Neustadt, L.L.P.

(57) ABSTRACT

The present invention relates to the field of integrating electronic systems that operate at mm-wave and THz frequencies. A monolithic multichip package, a carrier structure for such a package as well as manufacturing methods for manufacturing such a package and such a carrier structure are proposed to obtain a package that fully shields different functions of the mm-wave/THz system. The package is poured into place by polymerizing photo sensitive monomers. It gradually grows around and above the MMICs (Monolithically Microwave Integrated Circuit) making connection to the MMICs but recessing the high frequency areas of the chip. The proposed approach leads to functional blocks that are electromagnetically completely shielded. These units can be combined and cascaded according to system needs.

7 Claims, 14 Drawing Sheets

(51) Int. Cl.
*H05K 1/02* (2006.01)
*H05K 1/18* (2006.01)
*H01L 23/66* (2006.01)
*H01L 25/16* (2006.01)
*H01L 23/498* (2006.01)
*H01L 23/538* (2006.01)
*H05K 3/30* (2006.01)
*H05K 1/16* (2006.01)

(52) U.S. Cl.
CPC .............. *H01L 23/66* (2013.01); *H01L 25/16* (2013.01); *H05K 1/0243* (2013.01); *H05K 1/185* (2013.01); *H05K 3/301* (2013.01); *H05K 3/465* (2013.01); *H01L 2223/6616* (2013.01); *H01L 2223/6633* (2013.01); *H01L 2223/6677* (2013.01); *H01L 2223/6683* (2013.01); *H01L 2924/0002* (2013.01); *H05K 1/16* (2013.01); *H05K 2201/0715* (2013.01); *H05K 2201/0723* (2013.01); *H05K 2201/09972* (2013.01); *H05K 2201/09981* (2013.01); *H05K 2203/1469* (2013.01)

(56) References Cited

U.S. PATENT DOCUMENTS

| 5,151,769 | A | | 9/1992 | Immorlica, Jr. et al. | |
|---|---|---|---|---|---|
| 5,450,046 | A | * | 9/1995 | Kosugi | H01L 23/552 257/E23.114 |
| 5,559,363 | A | | 9/1996 | Immorlica, Jr. et al. | |
| 5,847,453 | A | * | 12/1998 | Uematsu | H01L 23/045 257/664 |
| 6,097,612 | A | * | 8/2000 | Ishikawa | H01L 23/66 174/535 |
| 6,297,551 | B1 | * | 10/2001 | Dudderar | H01L 23/055 257/686 |
| 6,534,855 | B1 | * | 3/2003 | Ahn | H01L 21/76898 257/698 |
| 6,603,193 | B2 | * | 8/2003 | Crane, Jr. | H01L 23/04 257/659 |
| 7,432,022 | B2 | * | 10/2008 | Kim | G03F 1/50 430/5 |
| 2002/0139573 | A1 | | 10/2002 | Gehrke et al. | |
| 2008/0116564 | A1 | * | 5/2008 | Yang | H01L 23/5389 257/698 |
| 2009/0101396 | A1 | * | 4/2009 | Mizuno | H01L 24/49 174/260 |

FOREIGN PATENT DOCUMENTS

| EP | 1 729 340 A1 | | 12/2006 | |
|---|---|---|---|---|
| EP | 1 777 775 A1 | | 4/2007 | |
| GB | 2292833 A | | 3/1996 | |
| JP | GB 2292833 A | * | 3/1996 | ............ H01L 23/66 |
| WO | WO 2004/070835 A1 | | 8/2004 | |

OTHER PUBLICATIONS

Wolfgang Daum, et al., "Overlay High-Density Interconnect: A Chips-First Muitichip Module Technology", IEEE Computer, Apr. 1993, pp. 23-29.

Bradley Dufour, et al., "Microwave Multi-Chip Module Utilizing Aluminum Silicon Carbide With In-Situ Cast Components and High Density Interconnect Technology", International Conference on Multichip Modules, 1997, pp. 309-314.

R. J. Saia, et al., "3-D Stacking Using the GE High Density Muitichip Module Technology", MCM '94 Proceedings, 1994, pp. 285-292.

Ray Fillion, "Advanced Packaging Technology for Leading Edge Microelectronics and Flexible Electronics", Lecture Series on Flexible Electronics, GE Global Research, Cornell University, MSE 542, Jul. 11-13, 2005, 197 pages.

W. Greig, "Integrated Circuit Packaging, Assembly and Interconnections", Springer, http://www.springer.com/978-0-387-28153-7, 2007, 9 pages.

Extended Search Report dated Sep. 16, 2013 in European Application No. 12151074.7.

Partial Search Report dated Apr. 23, 2013 in European Application No. 2151074.7.

Combined Chinese Office Action and Search Report dated Oct. 8, 2014 in Patent Application No. 201210020793.4 (with English Translation of Category of Cited Documents).

\* cited by examiner

METHOD OF MANUFACTURING A PACKAGE FOR EMBEDDING ONE OR MORE ELECTRONIC COMPONENTS

CROSS-REFERENCE TO RELATED APPLICATIONS

This application is a continuation of U.S. application Ser. No. 13/348,295, filed Jan. 11, 2012, which is based upon and claims the benefit of priority to European patent application 11151208.3 filed on Jan. 18, 2011. The entire contents of the foregoing application is hereby incorporated by reference into the present disclosure.

FIELD OF THE INVENTION

The present invention relates to a method of manufacturing a carrier structure of a package for embedding one or more electronic components, in particular microwave integrated circuits and discrete passive components, and to a method of manufacturing a package comprising one or more electronic components.

Further, the present invention relates to a carrier structure of a package for embedding one or more electronic components, in particular microwave integrated circuits and discrete passive components, to an electronic component for being embedded in a carrier structure of a package and to a package comprising such a carrier structure and one or more electronic system embedded therein.

BACKGROUND OF THE INVENTION

WO 2004/070835 A1 discloses a method for producing microsystems comprising microelectronic components that are inserted into cavities created during the layered construction of a base body consisting of a photocurable material, said components being situated adjacent to and/or above one another on several planes and being interconnected either electrically or thermally. Once said microelectronic components have been inserted, the layered construction of the base body continues and a structure is constructed consisting of an electrically or thermally conductive material that projects vertically above the contacts (pads) of the electronic component, said conductive material producing a direct connection to an additional electronic component above the first electronic component or to one or several additional electronic components that is or are located at a lateral distance from said first component by means of a conductor track that runs horizontally from the conductive material projecting vertically above the pad. Such a method is also known as RMPD (Rapid Micro Product development) method.

These and other known methods for manufacturing a package for embedding one or more electronic components, in particular microwave integrated circuits and discrete passive components, and methods for manufacturing electronic systems show various problems or disadvantages.

The size of MMICs (Monolithically Microwave Integrated Circuits) at mm-wave/THz frequencies is often larger than half the free space wavelength $\lambda_0$. This is certainly true when multiple system functions are integrated on a single MMIC. At THz frequencies chip-to-chip connections become very lossy and single-chip analog front-ends or multi-channel chips will likely be encountered with sizes larger than $\lambda_0$. At chip interconnections guided wave modes get disturbed. In these regions modal coupling to unwanted cavity modes inside the package can be excited. The same modal coupling mechanisms can occur in unshielded filter sections. The package gets prone to such coupling effects when the cavities get larger than $\lambda/2$ where $\lambda$ is the free space wavelength divided by the square root of the dielectric constant of the package material. Largest cavity sizes are possible using air cavities.

Dielectric losses of packaging materials increase with frequency. Thus, the full embedding of MMICs in dielectric material is practically not attractive anymore at mm-wave/THz frequencies but is done at lower frequencies. In addition, MMICs also change their behavior due to the change in the propagation constants in such an approach.

The most rigorous way to suppress cavity modes inside the package is to reduce the size of the cavities below the critical size of $\lambda/2$ where $\lambda$ is the wavelength in the dielectric material ($\lambda \leq \lambda_0$). This requires the attachment of a lid on the MMIC. The photolithographically structured features on the front side of the MMIC become very small and little area is available for lid attachment on the chip. Specific processes are necessary to attach and connect a lid onto a MMIC. MMICs are often thin and fragile, and mechanical attachment to the lid is difficult, e.g. using a flip-chip approach. An alternative solution may be using lids that do not touch the MMIC but employ periodic bandgap structures. They are often difficult to design and their ability to suppress cavity modes is band-limited. In addition small manufacturing changes may shift the suppression band. Packaging of wideband systems is challenging. Alternatively, wideband absorbing materials can be introduced but they also absorb energy of information carrying guided modes.

Filter structures are required in most of receiving or transmitting mm-wave/THz systems. Their size is large compared to the wavelength and integration of such components into the package may either alter the original filter characteristic or disturb other functional blocks of the system due to modal coupling into spurious package modes.

Current low volume package solutions are composed of several different parts that need to be assembled together. Assembly and machining tolerances are critical. Achieving hermetic or near-hermetic sealing requires specialized attachment methods. On the other hand a simple package structure is required with as little manual or semi-automated assembly steps as possible. In addition, batch processing is a fundamental requirement for low-cost production.

Many packaging approaches at mm-wave and THz frequencies cannot be decomposed into electromagnetically separated units. Multichip packages are difficult to design and hard to debug due to the complex electromagnetic situation inside the package. This leads to long design cycles. Alternatively each functional block requires a separate package which leads to the problem of interconnecting these packages at mm-wave/THz frequencies. The so called split block technology is commonly in use in these scenarios which may lead to bulky and expensive electronic systems.

It shall be noted that herein reference is made to the frequency range of 30-300 GHz as mm-wave frequency range. THz frequencies and THz applications often refer falsely to a spectrum starting from 300 GHz in literature. This commonly accepted definition is adopted hereinafter, although the spectrum should actually be called the Sub-THz frequency range. Thus, references made to THz frequencies hereinafter shall be understood as comprising a frequency range from at least 300 GHz to 3 THz. Hereinafter, reference is also made to microwave frequencies, which shall be understood as the same frequency range of approximately 30 GHz to 3 THz. Microwave integrated circuits may operate up to at least 3 THz.

BRIEF SUMMARY OF THE INVENTION

It is an object of the present invention to provide a method of manufacturing a carrier structure of a package for embedding one or more electronic components and to a method of manufacturing a package by which the above explained disadvantages are prevented.

It is a further object of the present invention to provide a carrier structure of a package for embedding one or more electronic components, an electronic component for being embedded in a carrier structure and to a package by which the above explained disadvantages are prevented.

According to an aspect of the present invention there is provided a method of manufacturing a carrier structure of a package for embedding one or more electronic components, in particular microwave integrated circuits and discrete passive components, said method comprising the steps of:

forming a back-side metallization layer, forming a polymer profile in layers on top of said backside metallization layer by subsequently forming two or more polymer layers by photo polymerisation, wherein one or more cavities are formed in said polymer profile for placing one or more electronic components therein, said electronic components having a back-side terminal and one or more front-side terminals, forming a front-side metallization layer on top of said polymer profile.

According to a further aspect of the present invention there is provided a carrier structure of a package for embedding one or more electronic components, in particular microwave integrated circuits and discrete passive components, comprising:

a back-side metallization layer, a polymer profile formed in layers on top of said backside metallization layer by subsequently forming two or more polymer layers by photo polymerisation, said polymer profile comprising one or more cavities for placing one or more electronic components therein, said electronic components having a back-side terminal and one or more front-side terminals, and a front-side metallization layer on top of said polymer profile.

According to a further aspect of the present invention there is provided a method of manufacturing a package comprising one or more electronic components, said method comprising the steps of:

fixedly embedding one or more electronic components, in particular microwave integrated circuits, in one or more cavities of a carrier structure of a package, in particular of a carrier structure as proposed according to the present invention, said carrier structure having a back-side metallization layer, a profile formed on top of said backside metallization layer, said profile comprising one or more cavities for placing one or more electronic components therein, and a front-side metallization layer on top of said profile, said electronic components having a back-side terminal connecting to said front-side metallization layer of said carrier structure and one or more front-side terminals, forming an intermediate cover layer, in particular of a polymer or a dielectric material, on top of said carrier structure and said embedded one or more electronic components, wherein intermediate connection terminals are provided in said intermediate cover layer for connection to said front-side metallization layer of said carrier structure and/or to one or more front-side terminals of said one or more electronic components, forming a signaling metallization layer in predetermined areas on top of said cover layer, said signaling metallization layer connecting to at least one front-side terminal of said respective electronic component through at least one intermediate connection terminal, forming a top cover layer, in particular of a polymer or a dielectric material, on top of said intermediate cover layer and said signaling metallization layer, respectively, wherein top connection terminals are provided in said top cover layer for connection to predetermined intermediate connection terminals, and forming a top metallization layer in predetermined areas on top of said top cover layer connecting through said top connection terminals and predetermined intermediate connection terminals to one or more front-side terminals of one or more predetermined electronic components and/or to said front-side metallization layer of said carrier structure.

According to a further aspect of the present invention there is provided an electronic component, in particular microwave integrated circuit or discrete passive component, in particular for being embedded in a carrier structure of a package as proposed according to the present invention, comprising:

a central component body comprising one or more functional elements, a back-side terminal provided on a back-side of said central component body for connection to a front-side metallization layer of said carrier structure, and one or more front-side terminals on a front-side of said central component body Finally, according to a further aspect of the present invention there is provided a package comprising:

a carrier structure, said carrier structure having a back-side metallization layer, a profile formed on top of said backside metallization layer, said profile comprising one or more cavities for placing one or more electronic components therein, and a front-side metallization layer on top of said profile, one or more electronic components, in particular microwave integrated circuits and discrete passive components, embedded in one or more cavities formed in said carrier structure, an intermediate cover layer, in particular of a polymer or a dielectric material, formed on top of said carrier structure and said embedded one or more electronic components, wherein intermediate connection terminals are provided in said intermediate cover layer for connection to said front-side metallization layer of said carrier structure and/or to one or more front-side terminals of said one or more electronic components, a signaling metallization layer formed in predetermined areas on top of said cover layer, said signaling metallization layer connecting to at least one front-side terminal of said respective electronic component through at least one intermediate connection terminal, a top cover layer, in particular of a polymer or a dielectric material, formed on top of said intermediate cover layer and said signaling metallization layer, respectively, wherein top connection terminals are provided in said top cover layer for connection to predetermined intermediate connection terminals, and a top metallization layer formed in predetermined areas on top of said top cover layer connecting through said top connection terminals and predetermined intermediate connection terminals to one or more front-side terminals of one or more predetermined electronic components and/or to said front-side metallization layer of said carrier structure.

Preferred embodiments of the invention are defined in the dependent claims. It shall be understood that the claimed devices and methods generally have similar and/or identical preferred embodiments as described herein and as defined in the dependent claims.

The present invention is based on the idea to provide a carrier structure of a package and a monolithic multichip package that fully shields different functions of the electronic system, e.g. of a mm-wave/THz system. The package is preferably poured into place by polymerizing photo sensitive monomers. It gradually grows around and above the electronic components, e.g. MMICs, making connection to the electronic components, but recessing the high frequency areas of the electronic component.

The proposed approach leads to functional blocks that are electromagnetically completely shielded. These units can be combined and cascaded according to system needs. The danger is minimized that unwanted resonant modes inside the package are excited which cause system failures hard to debug. The functional blocks once characterized properly can be used in system simulations to investigate arbitrary system architectures. Rapid translation of system level designs into a real package will become possible and may accelerate the development of such electronic systems.

BRIEF DESCRIPTION OF THE DRAWINGS

These and other aspects of the present invention will be apparent from and explained in more detail below with reference to the embodiments described hereinafter. In the following drawings

DETAILED DESCRIPTION OF THE INVENTION

The present invention makes use of a method of manufacturing by which packages for embedding one or more electronic components, in particular microwave integrated circuits and discrete passive components (e.g. capacitors or resistors), are more or less cast from a single piece of material. The final package is in that sense a kind of monolithic package. The package material is preferably a light sensitive monomer that is steadily poured into place in thin layers and hardened by photo polymerization using light at UV or other wavelengths.

Such methods have become available in recent years for manufacturing of microparts and are used for integrating chips at lower frequencies, i.e. frequencies much below the microwave spectrum. Micrometer precision in vertical and lateral dimensions is possible. Common materials belong to the group of acrylics. However, these materials often exhibit high dielectric losses which are not very attractive for multichip packages at mm-wave/THz frequencies. Such a manufacturing process is, for instance, known as RMPD (Rapid Micro Product development) process.

Figure 1:
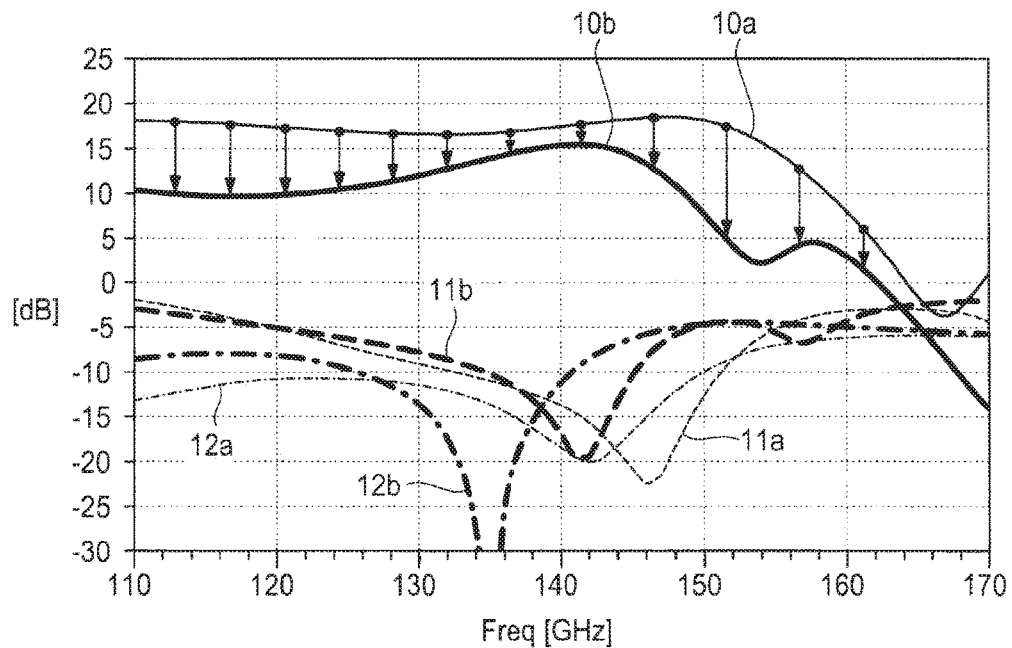
FIG. 1 shows a diagram showing the performance of a low noise amplifier in air and covered by polymer.

Full embedding of mm-wave/THz MMICs (Monolithically Microwave Integrated Circuits) into acrylic materials has been investigated by electromagnetic simulations. The results, in particular the low noise amplifier performance in the frequency range from 110 to 170 GHz in air and, alternatively, covered by polymer material, are depicted in FIG. 1. The curve 10a, 10b depicts the gain in dB of the amplifier, wherein the curve 10a is the gain for a chip in air and the curve 10b is the gain for the same chip covered by polymer. The curves 11a, 11b and 12a, 12b depict the amount of reflections at the input and output, also for the chip in air (curves 11a, 12a) and the chip covered by polymer (curves 11b, 12b). The gain drops significantly when the chip is covered by the polymer material. Such an alteration of chip performance is prohibited for most of the systems at mm-wave/THz frequencies.

Figure 2:
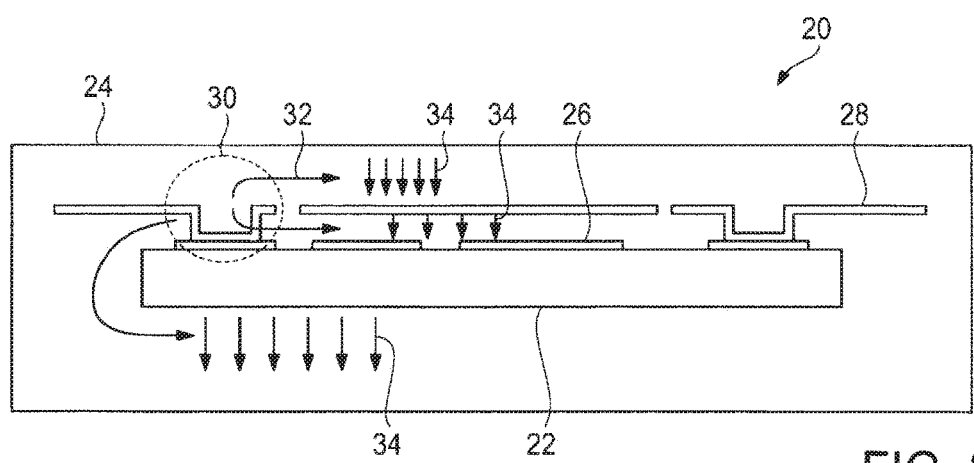
FIG. 2 shows an embodiment of a known electronic system.

The conventional packaging approach for MEMS and low frequency circuits using the RMPD process fully embeds a silicon chip into polymer as depicted in FIG. 2 showing an electronic system 20 in which the chip 22 is fully embedded into a package material 24 (polymer). On top of the chip 22 there is chip metallization layer 26, which partly connects to a metal package interconnection layer 28. At the used frequencies the chip package is much smaller than a wavelength, e.g. at 5 GHz the wavelength λ in the package material (dielectric constant $\epsilon_R$=2.7) is 36 mm. Packages smaller than 18 mm are not prone to parasitic cavity modes. In comparison the material wavelength λ at 140 GHz is about 1.3 mm. The width of the investigated MMIC in FIG. 1 is 1 mm which is greater than λ/2.

As shown in FIG. 2 at transitions 30 there exist unwanted excitation paths 32 for unwanted spurious package modes 34 in such electronic systems 20. Such spurious package modes may lead to resonances and losses which shall generally avoided.

Figure 3:
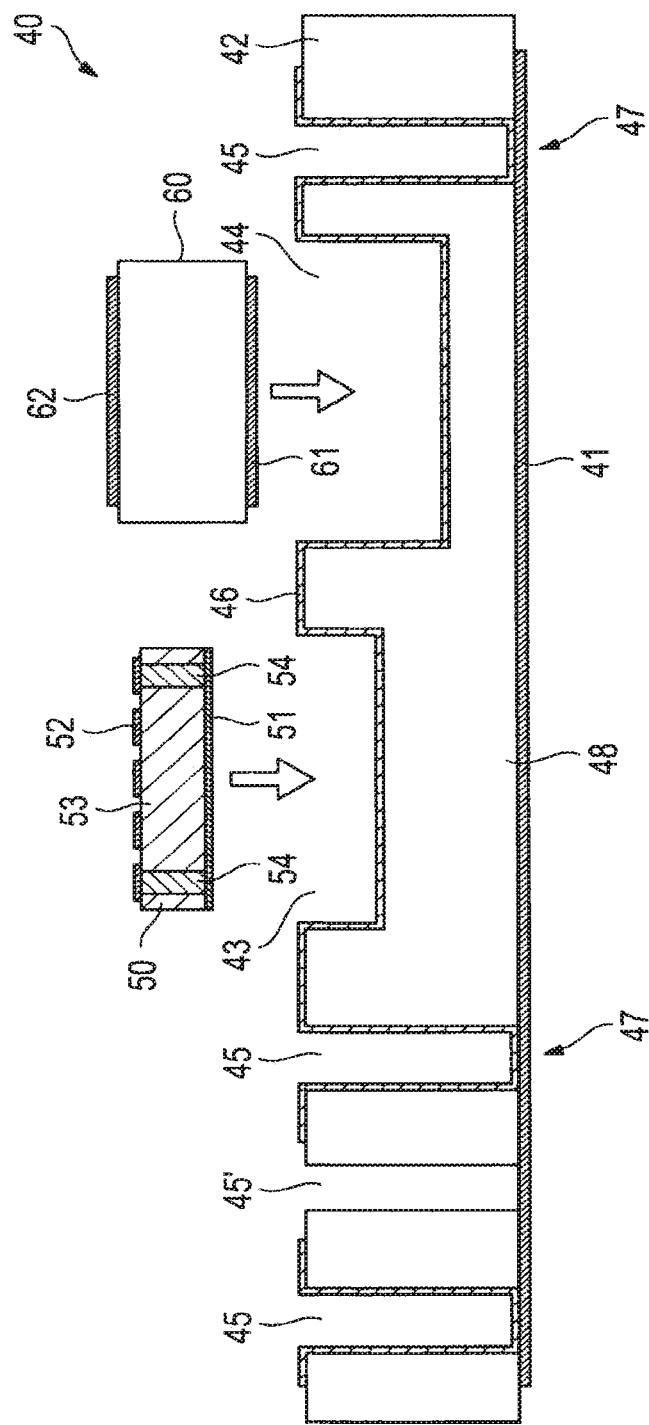
FIG. 3 shows an embodiment of a carrier structure of a package according to the present invention.
Figure 4:
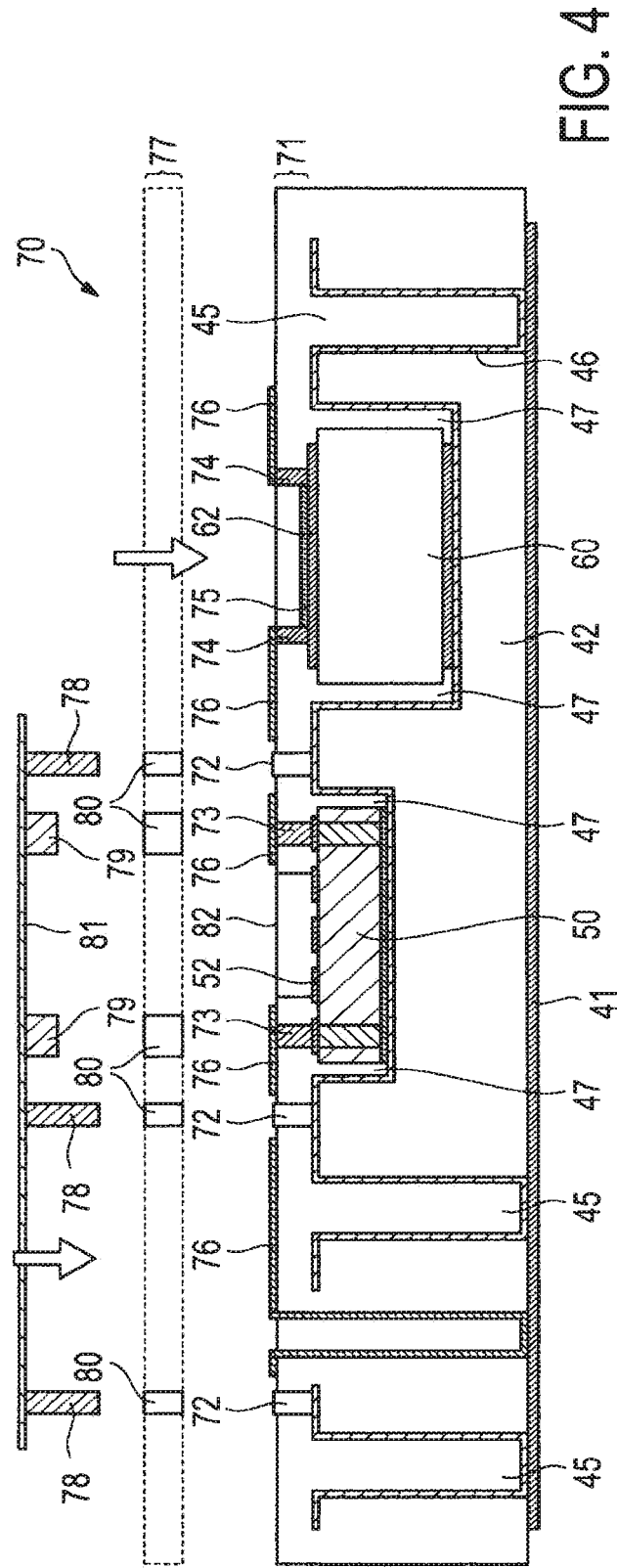
FIG. 4 shows an embodiment of manufacturing a package as shown in FIG. 5 according to the present invention.
Figure 5:
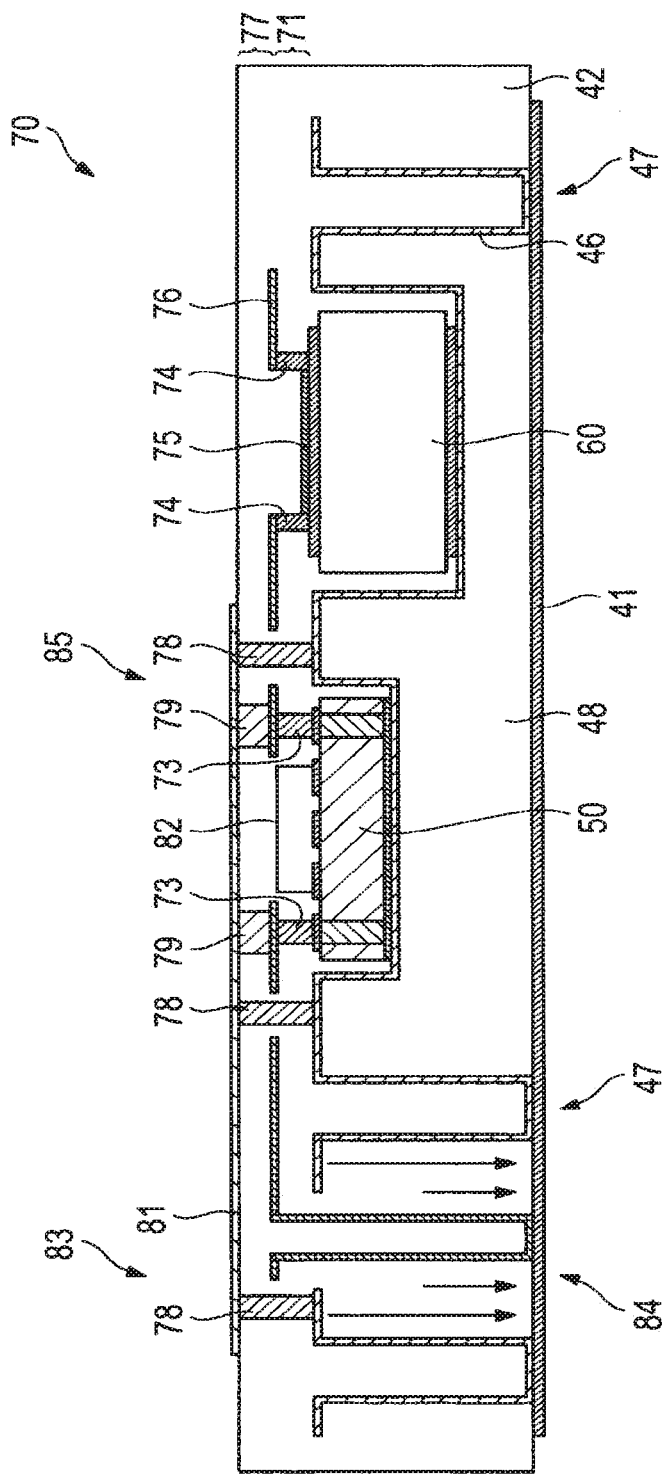
FIG. 5 shows an embodiment of a package according to the present invention.
Figure 6:
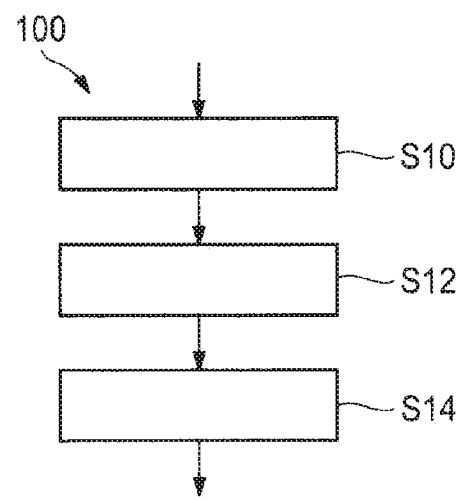
FIG. 6 shows a flow chart illustrating a method of manufacturing the carrier structure of the package according to the present invention.
Figure 7:
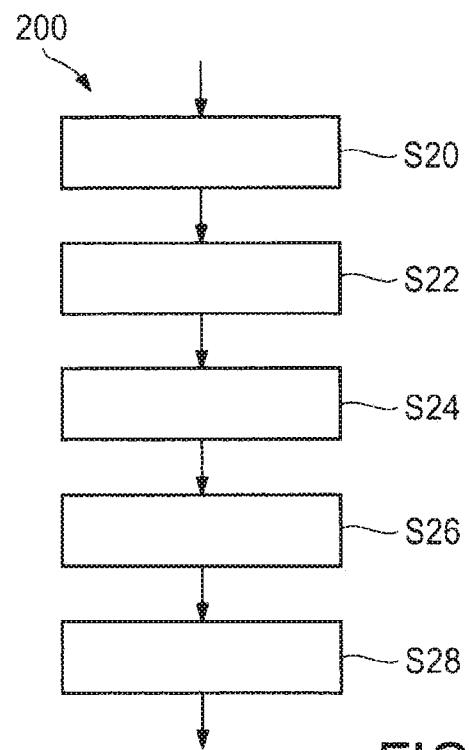
FIG. 7 shows a flow chart illustrating a method of manufacturing the package according to the present invention.

The method of manufacturing a carrier structure of a package and of a package according to the present invention shall be illustrated by use of FIGS. 3 to 7. FIG. 3 shows an embodiment of a carrier structure of a package manufactured according to the manufacturing method of the present invention. FIG. 4 shows an intermediate step for manufacturing a package according to a manufacturing method of the present invention. FIG. 5 shows an embodiment of package manufactured according to this manufacturing method. FIG. 6 shows a flow chart illustrating the steps of a method for manufacturing a carrier structure according to the present invention as shown in FIG. 3. FIG. 7 shows a flow chart illustrating the steps of a method for manufacturing package according to the present invention in accordance with FIGS. 4 and 5.

First, an embodiment of the method 100 for manufacturing a carrier structure 40 of a package 70 for embedding one or more electronic components 50, 60, in particular microwave integrated circuits and discrete passive components, shall be explained with reference to FIGS. 3 and 6.

In a first step S10 of the method 100 a back-side metallization layer 41 is formed. In a second step S12 a polymer profile 42, in particular a staircase profile, is formed in layers on top of said backside metallization layer 41 by subsequently forming two or more polymer layers. Said polymer layers (which can not be separately identified in FIG. 3) are poured gradually into place by photo polymerization of the polymer, in particular a basic monomer in liquid form. The solid profile 42 is built up in small layers which allows steep sidewalls with little taper. Otherwise the subsequent metallization step S14 would not reliably coat on cavities 43, 44 and particularly on deep trenches 45 formed in said polymer profile 42. Subsequently, in step S14 a front-side metallization layer 46 is formed on top of said polymer profile 42 resulting in the carrier structure 40 of package 70.

The cavities 43, 44 are provided in the carrier structure 40 for placing one or more electronic components 50, 60 therein. Preferably, each electronic component is placed in a separate cavity. The electronic components 50, 60 for placement in such a carrier structure 40 generally have a back-side terminal 51, 61 for connection to said front-side metallization layer 46 of the carrier structure 40 and one or more front-side terminals 52, 62, to which other connections can be made when the complete package is manufactured as will be explained below. In the embodiment shown in FIGS. 2 to 5 the electronic component 50 is a microwave integrated circuit, in particular a MMIC, and the electronic component 60 is a discrete passive component, e.g. a discrete capacitor.

Next, an embodiment of the method 200 for manufacturing the package 70 shown in FIG. 5 shall be explained with reference to FIGS. 4, 5 and 7.

In a first step S20 of the method 200 (depicted in FIG. 7) the electronic components 50, 60 are fixedly placed in the respective cavities 43, 44 of the carrier structure 40. In particular, as shown in FIG. 3, the microwave integrated circuit 50 is placed in the cavity 43 and the discrete capacitor 60 is placed in the cavity 44. The carrier structure 40 of the package 70 is preferably manufactured by a method as explained above, but may also be manufactured by other methods. For instance, the profile 42 may be formed of silicon rather than polymer.

In a second step S22, as shown in FIG. 4, an intermediate cover layer 71, in particular of a polymer or a dielectric material, is formed on top of said carrier structure 40, in particular on top of said front-side metallization layer 46, and on top of said embedded electronic components, i.e. covering at least part of said front-side terminals 52, 62. As shown in FIG. 4 the material of the cover layer 71 is also filled into some or all trenches 45 and into the gaps 47 that have remained between the electronic components 50, 60 and the side walls of the cavities 43, 44. Recesses are reserved in areas 73 and 74 for forming metalized connections to the front-side terminals 52, 62 of said electronic components 50, 60.

Further, in this step S22 intermediate connection terminals 73, 74 are manufactured in said intermediate cover layer 71 for connection to one or more front-side terminals 52, 62 of said electronic components 50, 60. The intermediate connection terminals 73 connect to the front-side terminals 52 of the microwave integrated circuit 50 and the intermediate connection terminals 74 connect to the front-side terminals 62 of the capacitor 60. The intermediate connection terminals 73 and 74 are first not metalized. These are only recesses in the intermediate cover layer 71. When forming the signaling layers 76 (in a metallization step) the electrical connections to the terminals front-side terminals 52, 62 on said electronic components is achieved.

Further, in this embodiment of the method recesses 72 (or openings) are provided in the intermediate cover layer 71, into which top connection terminals 78 are introduced in a later step, either separately or together with a top metallization layer 81 formed in step S28, as will be explained below. These connection terminals (formed at the positions of the recesses 72) are provided for connection to the front-side metallization layer 46 of said carrier structure 40. Thus, in successive metallization steps or the step that forms the signaling layer the top metallization layer connects through the recess 72 the structures underneath, i.e. it is a coating process that coats the sidewalls (where wanted).

Preferably, a connection layer 75 is formed on top of the front-side terminal 62 of the capacitor 60 between the intermediate connection terminals 74.

In the next step S24 a signaling metallization layer 76 is formed in predetermined areas on top of said intermediate cover layer 71, said signaling metallization layer 76 connecting to at least one front-side terminal 52, 62 of the electronic components 50, 60 through at least one intermediate connection terminal 73, 74. In case of component 60 the top-side terminal 62 is a lot larger compared to component 50. The recess that realizes the connection terminal 75 is also larger. The signaling layer 76 coats the recesses and makes a connection to the top side terminals 52, 62 of the electronic components 50, 60.

In step S26 a top cover layer 77, in particular of a polymer or a dielectric material, is formed on top of said intermediate cover layer 71 and said signaling metallization layer 76, respectively. Preferably, said top cover layer 77 is grown separately on a dummy carrier (not shown). It is only partially polymerized. The top cover layer 77 remains sticky for this reason. This top cover layer 77 is then attached (flipped) to the intermediate cover layer 71 (or vice versa the package is flipped onto layer 77 on the carrier). Then the dummy carrier is removed. Finally the polymerization is completed by further exposure by light. In this way the air cavity 82 is formed.

Further, top connection terminals 78, 79 are provided in said top cover layer 77. The top connection terminals 78 are provided for connection to predetermined intermediate connection terminals 72. The top connection terminals 79 are provided for connection to parts of the signaling metallization layer 76, in particular the parts of the signaling metallization layer 76 contacting to intermediate connection terminals 73 that are in contact with front-side terminals 52 of the microwave integrated circuit 50. These top connection terminals 78, 79 are preferably manufactured by providing corresponding recesses 80 (as a kind of placeholders) in the top cover layer 77, into which the top connection terminals 78, 79 are introduced separately or together with a top metallization layer 81 formed in step S28. In general, all "terminals" are initially not metalized. The metallization step coats the recess and establishes an electrical connection to the layers underneath.

Said top metallization layer 80 is formed in predetermined areas on top of said top cover layer 77 connecting through said top connection terminals 78, 79 and predetermined intermediate connection terminals 72, 73 to one or more front-side terminals 52 of one or more predetermined electronic components, here the microwave integrated circuit 50, and/or to said front-side metallization layer 46 of said carrier structure 40.

It shall be noted that the intermediate cover layer 71 and the top cover layer 77 are preferably formed from the same material and by use of the same general method as the polymer profile 42. Further, the thickness of the various layers, in particular of the layers constituting the polymer profile 42, intermediate cover layer 71 and the top cover layer 77 can be controlled through the polymerization. Generally, the thickness of a single layer is not larger than the height of the smallest "stair" of the staircase polymer profile 42. Typical thicknesses for a layer are in the range from 10 µm to 100 µm, for instance the cavity 43 is approximately 50 µm. The thickness of the package 40 is, for instance, approximately 300 µm. The intermediate cover layer 71 and the top cover layer 77 are each 20 µm thick for example.

FIG. 5 shows the package 70 as a result of the method 200 explained above.

For fixing the components 50, 60 in the respective cavities 43, 44 (in step S 20) several methods exist. For example, a partially polymerized thin layer on top of the staircase ground plane, i.e. the front-side metallization layer 46 on the bottom of the cavities, can be grown that has a certain adhesion. In another embodiment, a controlled amount of epoxy can be dispensed inside the cavities 43, 44 before component placement. In some embodiments the cavities 43, 44 are generally only a few micrometers wider than the actual components 50, 60 to be embedded therein, i.e. the gap 47 is generally rather small. This provides the further possibility of fixing the components 50, 60 in the cavities 43, 44 by pouring and polymerizing one or more next layers on top of the components 43, 44, such as the intermediate cover layer 71 as explained above.

During the formation (i.e. the growing and solidifying) of the intermediate cover layer 71 in step S22 a lift-off metallization step is preferably introduced where the microwave integrated component 50 is protected by a protection layer (not shown), e.g. a photoresist layer. Then, an air cavity 82 (see FIGS. 4 and 5) is formed in this embodiment above the microwave integrated component 50. Preferably a separate air cavity is formed above each microwave integrated component.

The top cover layer 77 and/or said top metallization layer 81 is formed by a transfer process using a sacrificial carrier substrate. In particular the partially polymerized thin lid layer 77 representing said top cover layer 77 is attached in a transfer process with a sacrificial carrier substrate. Polymerization is completed after attachment. Final metallization and photolithographic structuring completes the manufacture. The whole electronic system is in the end one solid unit since the different layers attach to each other just by polymerization and without the use of special gluing layers of other materials. Hermeticity is also guaranteed with this manufacturing approach which thus is an ideal solution for many sensing applications.

Microwave integrated components, like component 50, in particular MMICs, in accordance with the present invention and used in electronic systems according to the present invention have, as indicated in FIG. 3, a central component body 53 comprising one or more functional elements, a back-side terminal 51 provided on a back-side of said central component body 53 and one or more front-side terminals 52 on a front-side of said central component body 53. Further, metalized via holes 54 to the back-side terminal 51 are provided that prevent the excitation of modes inside the central component body 53 (also called MMIC substrate).

The staircase ground plane, i.e. the front-side metallization layer 46, draws through parts of the carrier structure 40 and connects to the back-side metallization layer 41 at the edges 47 of the component areas of the carrier structure, i.e. around the one or more areas in which the cavities 43, 44 are located. Both metallization layers 41 and 46 are structured with the same or different masks. They form a faraday shield 48 (i.e. some kind of closed chamber 48) between the edges 47 where they contact each other, inside which no package modes can exist.

In an embodiment some defined compartments 45' (also called polymer-free grooves or trenches) are opened and used to form the sidewalls of certain elements like cavity resonator filters, cavity backed antennas, orthogonal waveguide transitions or the like. For instance, as shown in FIG. 5, a fully shielded filter 83 is formed by a cavity resonator fed by metallized groove 84, which is formed by a groove 45, which is covered (in particular in step S24) by the signaling metallization layer 76, which contacts to the back-side metallization layer 41 at the bottom of the groove 45. When, in step S26 the top cover layer 77 is formed, the material of the top cover layer 77 (e.g. polymer) is also filled into the groove 45. The shielding of the filter 83 is obtained by forming contacting the front-side metallization layer 46 to the back-side metallization layer 41 in the neighboring grooves 45.

In other words, the filter 83 is composed of cavity resonators. The sidewalls are formed by the metalized grooves 45. Not all grooves 45 are metalized. The metallization layer 46 closes the cavity resonator on the top. Through a small aperture in the metallization layer 46 the cavity is excited/fed by metalized groove 84. The metalized groove 84 may connect to the bottom metallization 41 (as depicted in FIG. 5) but may also stop above the bottom metallization. The metalized groove 84 is metalized and connected to the signaling metallization layer 76. The feed areas around the feed aperture are shielded by through connections 78 and the lid layer 81.

Figure 8:
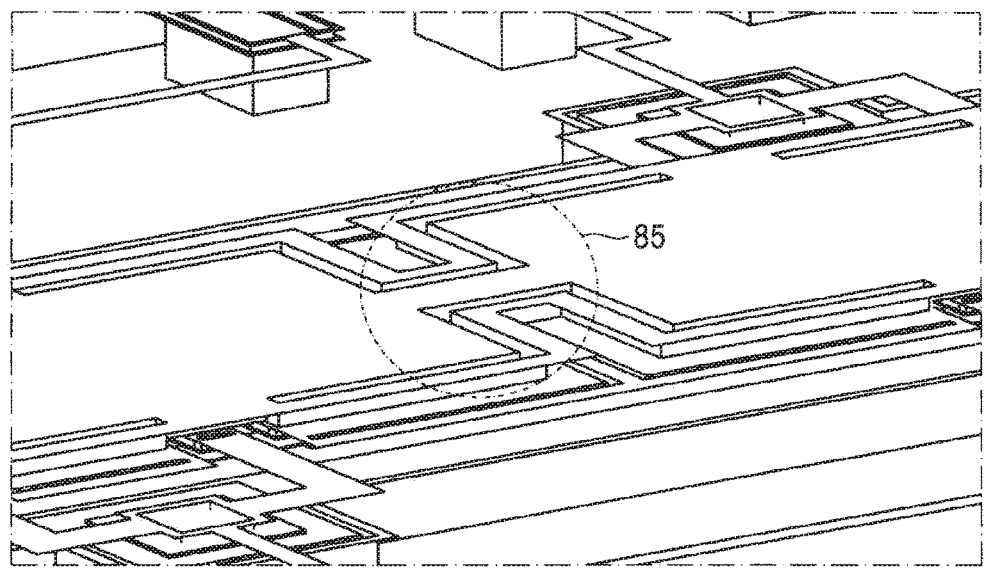
FIG. 8 shows a perspective view of a stripline interconnection according to the present invention.
Figure 9:
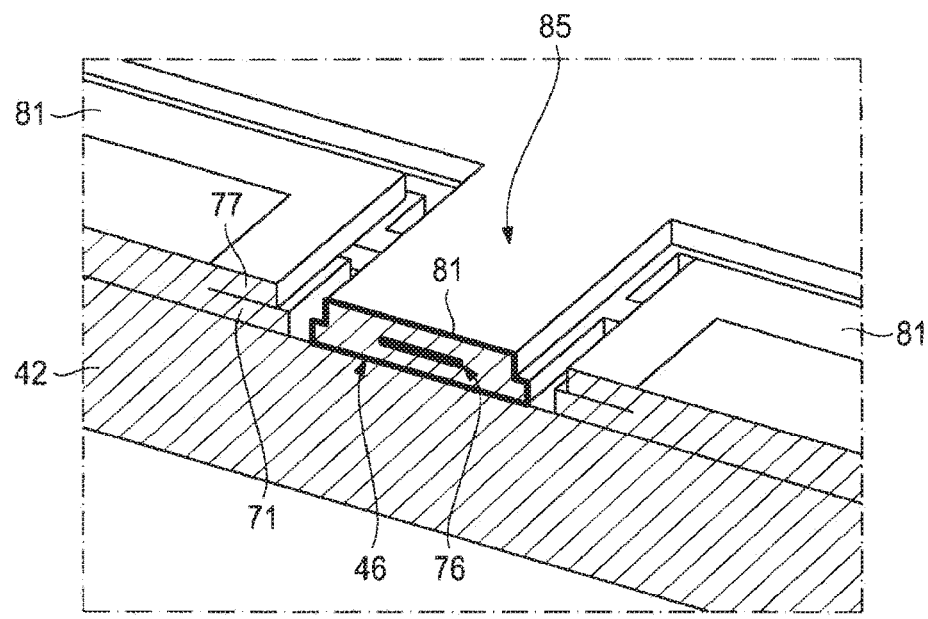
FIG. 9 shows a cross section of a stripline interconnection according to the present invention.

The signaling metallization layer 76 and the top metallization layer 81 together with the front-side metallization layer 46 form a stripline interconnection 85 between different components 50, 60 of the package 70. The signaling metallization layer 76 can represent a stripline interconnection layer and the top metallization layer 81 can represent a lid layer. Both the stripline interconnection layer 76 (here representing the center conductor) and the lid layer 81 may be connected to the back-side metallization layer 41 or to the top metallization layer 46. A cross section of an implementation of a stripline interconnection 85 (see FIG. 8) is shown in FIG. 9. It can be seen that these interconnections 85 are fully shielded. Metallization layer 46 connects to metallization layer 81 surrounding the signal conductor 76. Chip-to-chip interconnections can be kept shorter than 200 µm and higher dielectric material losses per wavelength can be tolerated up to THz frequencies. The cross section of the stripline interconnection 85 has a very small aperture which gives also an excellent isolation of parasitic evanescent modes that could tunnel through from functional block to functional block.

Figure 10A:
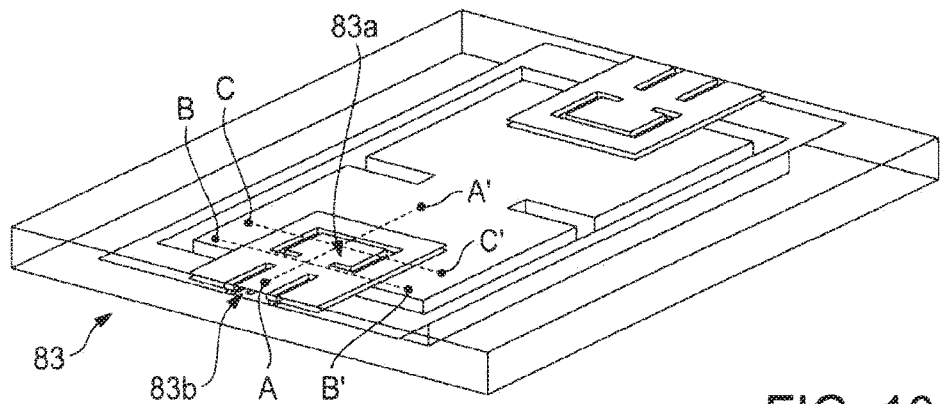
FIGS. 10A-10D show different views of a cavity filter according to the present invention.
Figure 10B:
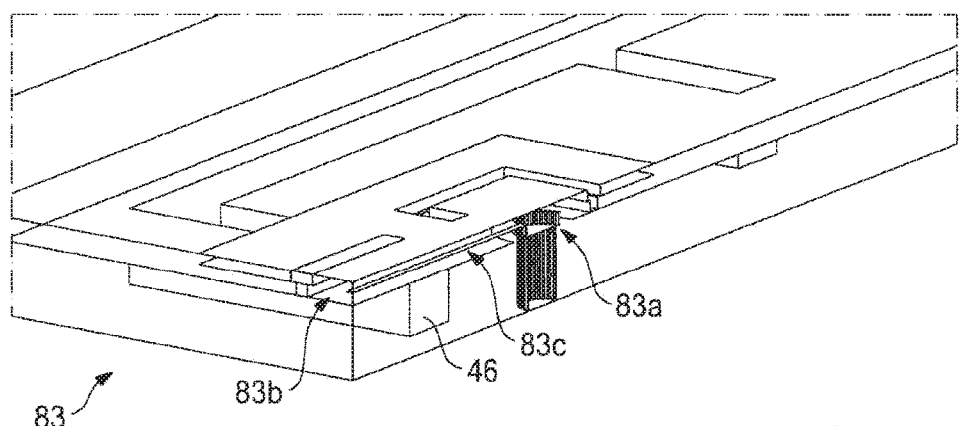
Figure 10C:
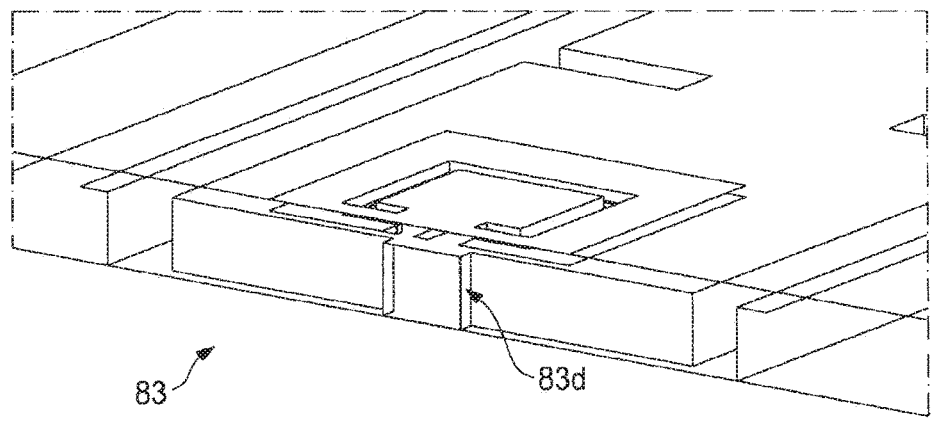
Figure 10D:
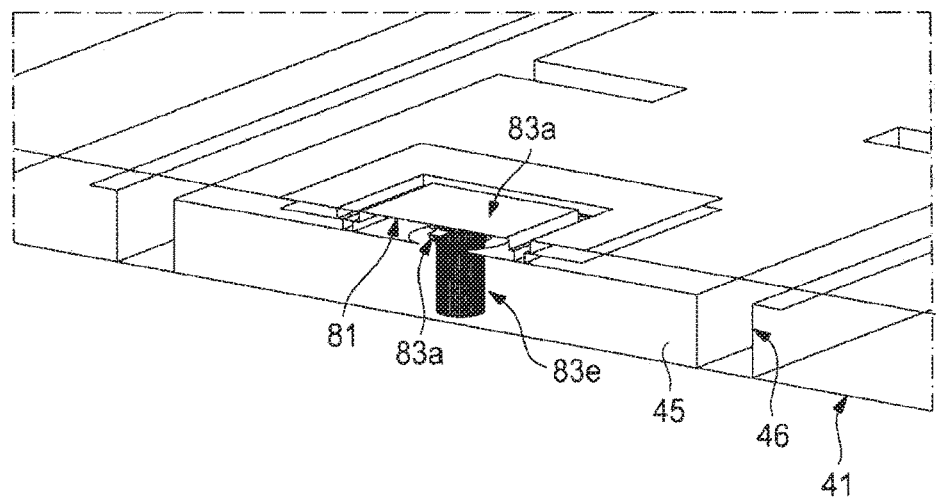

A preferred embodiment of a cavity filter 83 formed by tucking down the front-side metallization layer 46 to the back-side metallization layer 41 is shown in FIGS. 10A-10D. FIG. 10A shows a perspective view of the cavity filter 83. Particularly a shielded cavity feed 83*a* and a shielded stripline feed 83*b* are shown. FIG. 10B shows a cross section of the cavity filter 83 along A-A'. The cavity feed 83*a* with a via through aperture in the staircase ground plane 46. Further, a shielded stripline interconnection 83*c* is shown. FIG. 10C shows a cross section of the cavity filter 83 along B-B'. At position 83*d* the tucking down of the staircase ground plane 46 is interrupted to preserve parallel ground planes (46 and 81) of the stripline. FIG. 10D shows a cross section of the cavity filter 83 along C-C'. A metalized via 83*e* is shown here protruding into the cavity 45, which may also connect to the back-side metallization layer 41.

Figure 11A:
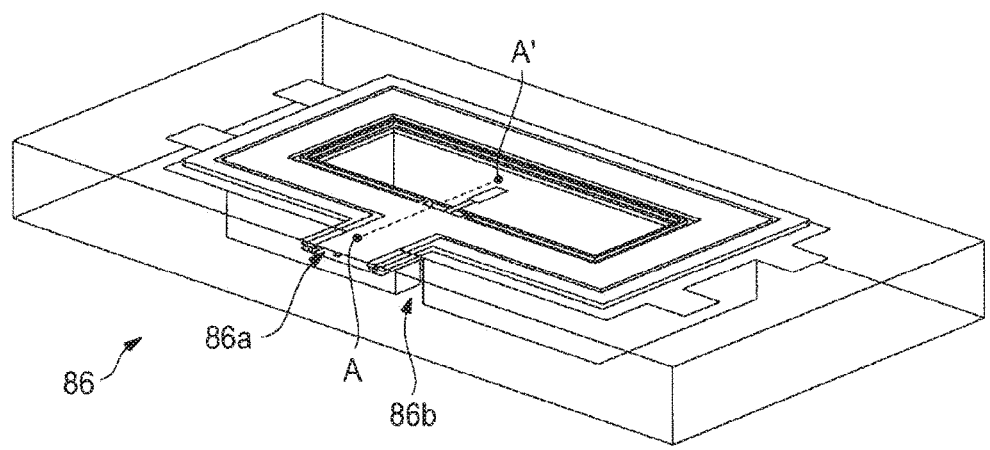
FIGS. 11A and 11B show different views of a waveguide transition according to the present invention.
Figure 11B:
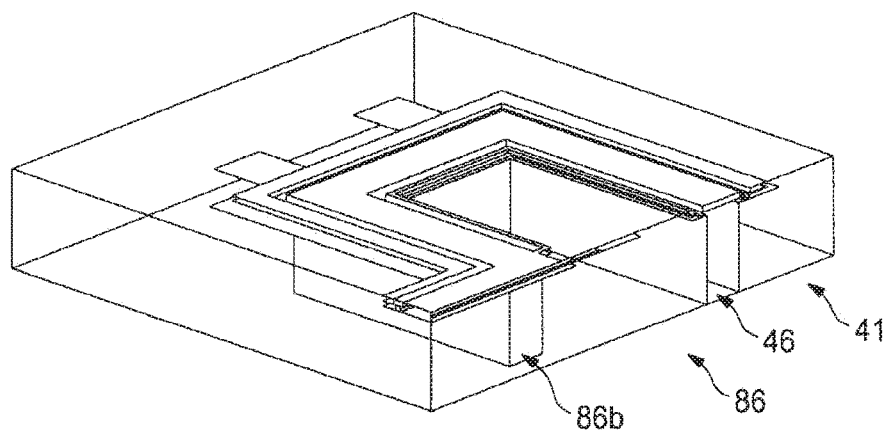

A preferred embodiment of a rectangular waveguide interface 86 formed by tucking down the front-side metallization layer 46 to the back-side metallization layer 41 is shown in FIGS. 11A and 11B. FIG. 11A shows a perspective view of the rectangular waveguide interface 86. Particularly, a stripline feed 86*a* and a polymer support 86*b* to preserve parallel ground planes for the stripline feed 86*a* are shown. FIG. 11B shows a cross section of the rectangular waveguide interface 86 along A-A'.

Both FIGS. 10A-10D, 11A, and 11B show the rigorous shielding concept provided according to preferred embodiments of the present invention. In the same way as the transition to the rectangular waveguide is implemented it is possible to implement a cavity backed planar antenna, for example a patch antenna.

The mode conversion from the stripline mode to the cavity mode of the filter or the rectangular waveguide mode occurs while suppressing any radiation into the rest of the package. The metalized sidewalls of both implementations shown in FIGS. 10A-10D, 11A, and 11B are tucked down to the backside metal but they are interrupted where polymer supports the ground plane of the stripline, i.e. to support the continuation of the ground plane of the stripline in the vicinity to the center/signal conductor. Otherwise the even stripline mode would be disturbed and reflected. The support is chosen as small as possible to prevent leakage out of the cavity.

Figure 12A:
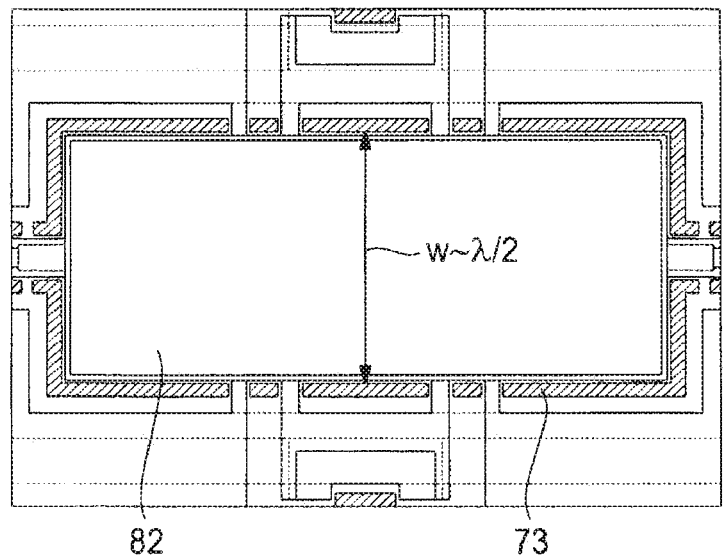
FIGS. 12A-12D show package layouts and chip layouts according to various embodiments of the present invention.
Figure 12B:
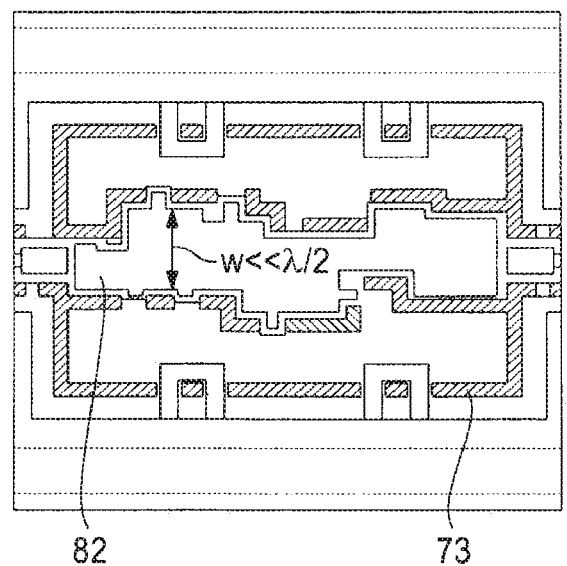

In another embodiment DC and RF areas (or components) of microwave integrated circuits are strictly separated. FIG. 12A shows a top view on a first embodiment of a proposed package layout and FIG. 12B shows a top view on a second embodiment of a proposed package layout, as maybe used for embedding a low noise amplifier operating at 140 GHz. The resulting layers for the air cavity 82 and the intermediate connection terminals 73 are also shown in both layouts.

The introduction of via holes to connect the lid, i.e. the top metallization layer 81, down to the MMIC requires supporting polymer material. In the first design example as shown in FIG. 12A there are only a few places on the inside of the MMIC where discrete square vias can be placed considering the design rules of the used manufacturing process. The discrete vias are means to suppress cavity modes in the large cavity. Since there are only a few places available the suppression is incomplete in many instances. In other words, suppression of cavity modes may be band-limited (due to the size of the cavity area having a width w of a size in the area of half the wavelength) and incomplete in many instances. The required supporting polymer material may get close to RF transmission lines and detune the MMIC's performance.

The preferably proposed layout shown in FIG. 12B allows the minimization of the cavity size (to a width much smaller than half the wavelength) by separating DC and RF components electromagnetically. In particular, the DC and RF components are located in different areas/compartments and shielded by the lid layer (76, 81) tucked down to the MMIC through connections 78, 79. For this purpose shielding connection terminals 87*a*, 87*b* are provided between the areas 88 (realized in this embodiment using layer 76 and 81) in which the DC components are placed and the areas 89 in which the RF components are placed as shown in FIG. 12D depicting a cross section through an exemplary chip layout shown in FIG. 12C. In comparison, the conventional chip layout accommodates DC and RF functions in the same air cavity of the package without shielding. Not only becomes the air cavity width close to half the wavelength in air but also parasitic modes could couple into DC networks.

Figure 12C:
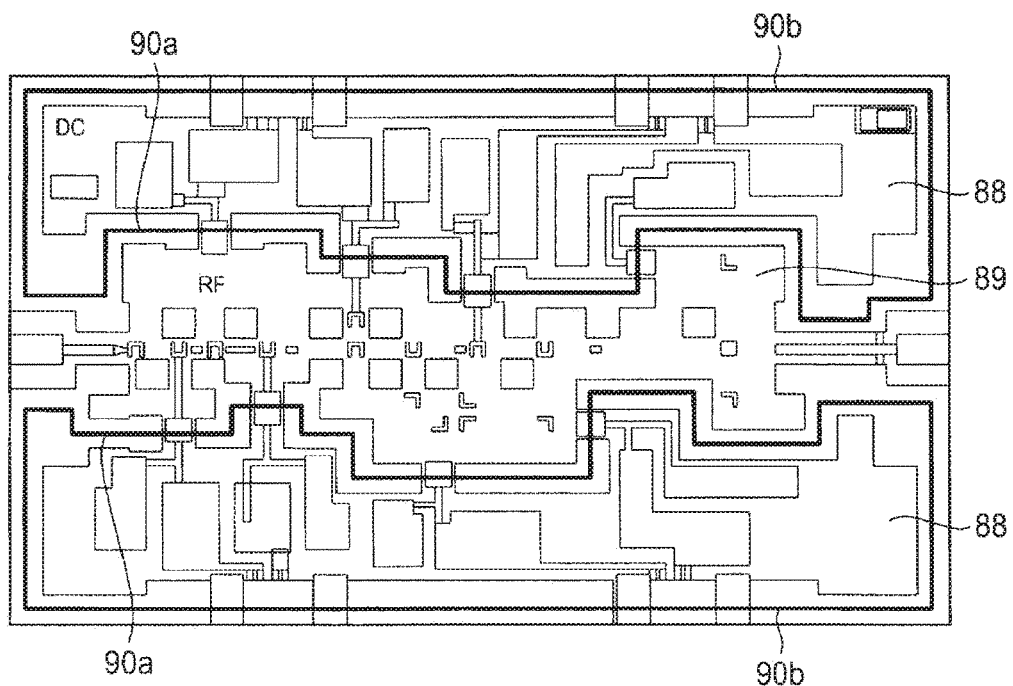
Figure 12D:
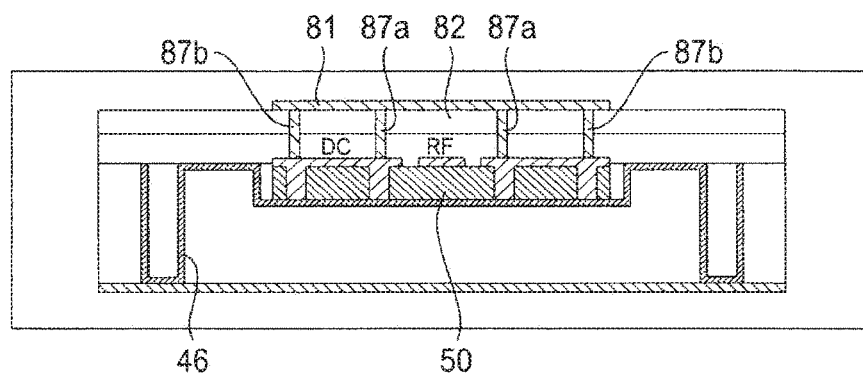

One of the features to be highlighted is the consequent introduction of a continuous landing pattern 90*a*, 90*b* for the package metallization layers shown in FIG. 12C. The areas 91 in the DC sections 88 are ground capacitors that cannot be used as landing areas. The ground parts of the lid 81 are tucked down to the landing patterns 90*a*, 90*b* of the MMIC through the shielding connection terminals 87*a*, 87*b*. The continuous landing pattern 90*a*, 90*b* allows almost perfect shielding of functional blocks from each other on a multi-function chip but spares the RF carrying transmission lines from being covered with polymer material.

Figure 13A:
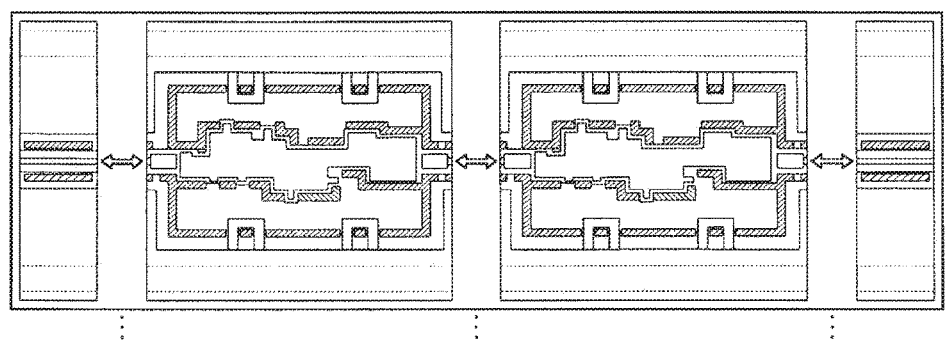
FIGS. 13A and 13B show an embodiment of cascading different functional blocks in an electronic system according to the present invention.
Figure 13B:

Concerning the modeling of the isolated functional blocks which are completely shielded units an embodiment is proposed that considers mismatch. FIG. 13A shows a block diagram of two cascaded amplifier building blocks connected to transmission lines (of the stripline type as proposed according to this invention) at the input and output. Each block in the corresponding system simulation shown in FIG. 13B is represented by a package layout component.

Figure 14:
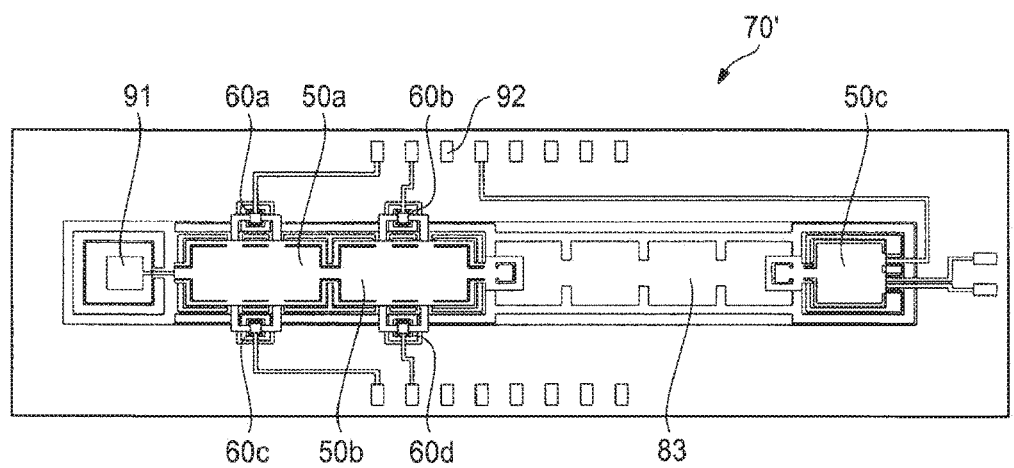
FIG. 14 shows an embodiment of the packaging of a receiver according to the present invention.

Once each functional block is characterized it can be used to investigate different system architectures and automatically transfer the systems into a package design which is ready for manufacturing. An example of a packaged receiver, as an exemplary embodiment of an electronic system 70' containing amplifier MMICs 50*a*-50*c*, integrated passive components 60*a*-60*d* the filter component 83 as described above, an integrated antenna 91 and I/O pads 92 (and possibly further components) is shown in FIG. 14 to demonstrate the simple construction of a system out of basic well defined components that is enabled by use of the present invention. Here the receiver can be considered as a system-in-package although no baseband signal processing function is included in the package, but is rather an electronic sub-system.

Typical polymer materials used for packaging have a relatively low thermal conductivity. Hence, in a further embodiment of a carrier structure 40' illustrated in FIG. 15 as a cross section one or more a polymer-free heat conducting grooves 95 are formed below parts of one or more cavities 43 so that the front-side metallization layer 46 contacts the back-side metallization layer 41 when formed on top of the polymer profile 42. Subsequently, before the microwave integrated component 50 is placed into the cavity 43, a heat conductive material 96, in particular epoxy or solder, is filled into said heat conducting grooves 95. This improves the heat transfer to the backside of the carrier structure 40' enabling higher power applications.

In an alternative embodiment of a carrier structure 40″ illustrated in FIG. 16 as a cross section a heat conductive cavity 97 is formed below the central part of one or more cavities 43. Said heat conductive cavity 97 has a smaller width than the adjacent cavity 43. Further, the heat conductive cavity is formed such that the front-side metallization layer 46 contacts the back-side metallization layer 41 when formed on top of the polymer profile 42. Subsequently, before the microwave integrated component is placed into the cavity 43, a heat conductive element 98, in particular a metallic block such as a solid metal base plate, is placed into said heat conductive cavity 97, said heat conductive element having a height such that the bottom surface of the microwave integrated component 50 once embedded into said cavity 43 contacts to the front-side metallization layer 46*a* formed on top of the polymer profile 42 on the bottom 43*a* of the cavity 43 around said heat conductive cavity 97 and to the top surface 98*a* of said heat conductive element 98.

Figure 15:
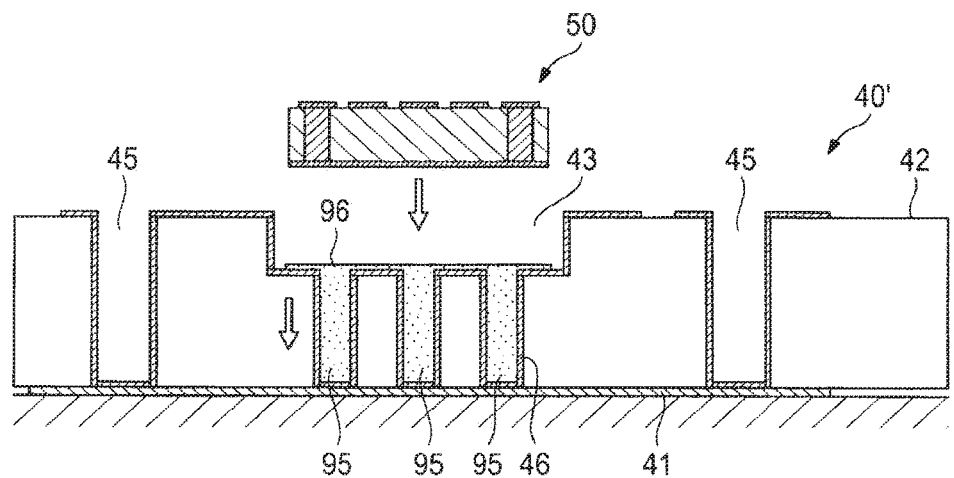
FIG. 15 shows another embodiment of a carrier structure of a package according to the present invention with a first embodiment of means for heat transfer.
Figure 16:
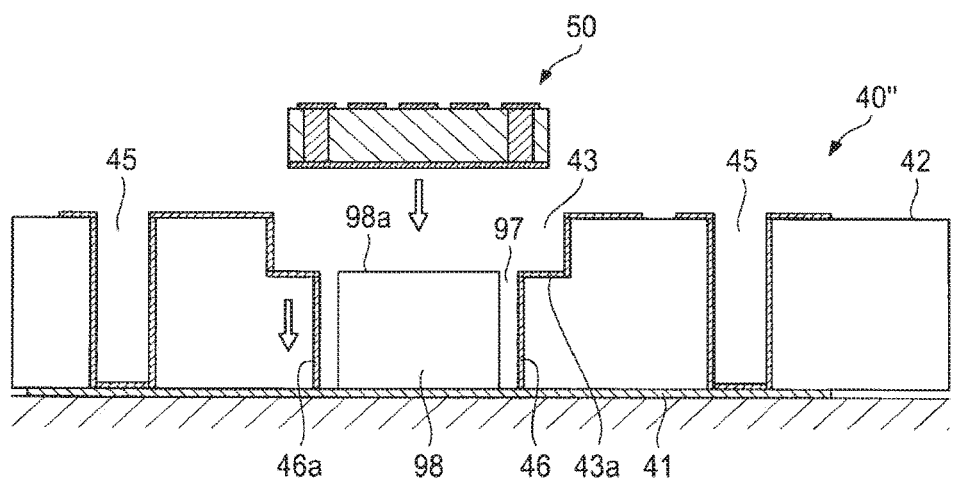
FIG. 16 shows another embodiment of a carrier structure of a package according to the present invention with a second embodiment of means for heat transfer.

It shall be noted that the heat conductive means shown in the embodiments of FIGS. 15 and 16 can be provided only beneath selected electric components or beneath all electric components. Preferably, those means are provided for electric components producing much heat during operation.

By use of the present invention and the various embodiments the problems and disadvantages of the known methods and systems are overcome.

The leveling problem of face-up packaging techniques is solved particularly by manufacturing the package monolithically by a process of polymerization of monomers. The package can be developed in height to any practical relevant thickness (typically occurring in practice) and devices (particularly MMICs and passive chip components) of different thicknesses can be embedded in the package in a face-up mounting technique having their front-side contact area at the same height level. Conventional face-up packaging processes are typically limited in this respect. For instance, in an embodiment the package is grown up to 50 mm (e.g. limited by the current manufacturing machines) which is for most of the practical cases enough, e.g. in combination with microfluidic elements or stacking multiple packages on top of each other. In other implementations the package should be as thin as possible. Generally, the packages are not much thicker as the electronic components embedded (in the order of 300 to 400 µm).

The cavity mode problem is solved rigorously in several ways, and thus the package becomes suitable for integrating mm-wave/THz systems. In particular, a staircase groundplane tucked to the backside metallization of the package is introduced. A faraday shield is realized on which the devices are mounted. Different compartments of this faraday shield can be realized. Some compartments can be opened to realize cavity filters, cavity backed antennas or back shorts for transitions to rectangular waveguides. The feeding of these compartments is fully shielded.

Further, the manufacturing process is used to realize a lid touching the MMIC but creating a small cavity above the RF parts of the MMIC. If the material would touch the MMIC RF parts they would not function to their optimum and losses would increase. The lid is thus preferably designed to shield different functions of the MMIC from each other. This is achieved by the introduction of continuous landing patterns on the MMIC, rigorously dividing the MMIC into functional blocks, for example separating RF and DC parts, and continuously connecting the ground layers of the lid to the MMIC.

Still further, the stripline transmission line type is preferably used to interconnect all RF components. This completes the full shielding concept. In this way a modular library of fully characterized functional blocks is developed that drastically speeds up the development cycles of novel mm-wave/THz systems.

Finally, thermal problems are solved by preferably using a thermal management of the face-up packaging approach which is improved by the introduction of fully filled thermal backside vias.

Multiple of the proposed packages can be combined to a full electronic system (for example a transmit system part and a receive system part). In general, one of these packages is a vital part of an electronic system working at mm-wave and THz frequencies that capsule all important microwave functions. The remaining parts are signal processing parts at lower GHz frequencies, e.g. at 0-10 GHz. Also external antenna lens parts or antenna reflector parts are left which would enhance the antenna in the package. The antenna in the package may e.g. illuminate a lens or a reflector. For instance multiple packages 70 can be stacked on top of each other and the process steps 100, 200 can be repeated on and on. In particular, after a first package is manufactured as explained above, the next package (with the same or different cavities and/or electronic components embedded therein) can be manufactured by the same method on top of the first package. This will particularly be used for manufacturing phased array systems.

The proposed package that capsules the mm-wave/THz frequency functions of the system may sometimes also be called a system-in-a-package (SiP) even though strictly speaking digital signal processing functions are part of another package (e.g. a conventional package used in microprocessors etc.). However, bare microprocessor chips could be included in the proposed package as well.

According to the present invention the package is grown together with the pattern of thermal vias/interconnections (monolithic aspect). The formation of the vias is not limited to circular via shapes. Further, the pattern can be optimized (honeycomb, circular, pillar type etc) to compromise thermal, mechanical and assembly requirements (amount of epoxy/solder consumed by the vias for example). Still further, it takes generally the same time independent of the thermal interconnection pattern to the backside. Preferably, the vias are closed at the backside, which prevents that the epoxy or solder will run underneath the backside of the package.

The top side and bottom side ground of the carrier structure can be connected not only at the edge of the package or by discrete circular vias. Rather a continuous connection (tucking down the topside ground plane to the bottom side ground plane) nearby the MMICs or groups of MMICs is suggested. It is further suggested using this approach to form closed compartments in the substrate to achieve cavity resonators (filled with dielectric material). In that sense a new use of front side—back side connection paths" is proposed.

The function of the upper dielectric layer is extended according to the present invention. Preferably, it is not just "perforated" over the chip terminals (which are usually located at the edge of the MMIC) to allow bridging the metal layers on top of said dielectric layer to make connection to the terminals of the chip. Instead, these layers are preferably extended close to the RF sections of the MMICs to form fully shielded compartments or functional blocks or to shield DC and RF parts of MMICs from each other. Functions on a large chip (larger than half the wavelength in the dielectric material) can be separated in that way at THz frequencies to avoid excitation of unwanted resonant modes. Since the dielectric layer is grown arbitrary shaped connections to the MIMIC can be made. Further, the present invention is not bound to form discrete vias in form of circular shape but rather prefers continuous vias for connecting package ground to MMIC ground.

The package is also relevant for the implementation of phased array systems of different architectures than explained above (e.g. tray or tile array architectures) where multiple receiver and transmitter channels are integrated in one package. In such scenarios often very tight spacing between the channels is required with minimal cross talk. The proposed approach is ideal to meet such requirements. Further, the package is also relevant for integration of systems with microfluidic features, e.g. in mm-wave/THz spectroscopic system.

The invention has been illustrated and described in detail in the drawings and foregoing description, but such illustration and description are to be considered illustrative or exemplary and not restrictive. The invention is not limited to the disclosed embodiments. Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. A single element or other unit may fulfill the functions of several items recited in the claims. The mere fact that certain measures are recited in mutually different dependent claims does not indicate that a combination of these measures cannot be used to advantage. Any reference signs in the claims should not be construed as limiting the scope.

The invention claimed is:

1. A method of manufacturing a package, the method comprising:
   forming a carrier structure by a process comprising:
      forming a back-side layer;
      forming a polymer profile on top of the back-side layer that comprises two or more polymer layers and one or more cavities;
      forming one or more compartments in the polymer profile; and
      forming a front-side metallization layer on top of the polymer profile;
   embedding one or more electronic components in the one or more cavities formed in the carrier structure; and
   forming an intermediate cover layer comprising a polymer or a dielectric material, on top of the carrier structure and the one or more embedded electronic components,
   wherein intermediate connection terminals are provided in the intermediate cover layer for connection to the front-side metallization layer of the carrier structure and/or to one or more front-side terminals of the one or more electronic components,
   wherein the formation of the polymer profile is controlled such that the depths of the one or more cavities are adapted to a thicknesses of the one or more electronic components such that a top surface of the one or more electronic components once embedded into the one or more cavities and a top surface of the front-side metallization layer around the embedded electronic components are on the same level, and
   wherein the compartments in the polymer profile comprise no or less polymer and/or no front-side metallization layer.

2. The method of claim 1, further comprising:
   forming a signaling metallization layer in predetermined areas on top of the intermediate cover layer, wherein the signaling metallization layer connects to at least one front-side terminal of the one or more electronic components through at least one intermediate connection terminal.

3. The method of claim 2, further comprising:
   forming a top cover layer comprising a polymer or a dielectric material, on top of the intermediate cover layer and the signaling metallization layer, respectively, wherein top connection terminals are provided in the top cover layer for connection to predetermined intermediate connection terminals.

4. The method of claim 1, further comprising, during the forming of the intermediate cover layer:
   filling gaps between the one or more electronic components and side walls of the one or more cavities with the polymer or dielectric material of the intermediate cover layer.

5. The method of claim 1, wherein, in the intermediate cover layer, an air cavity is formed above one or more front side terminals of predetermined electronic components.

6. The method of claim 1, wherein the intermediate cover layer and the top cover layer are formed from the same material.

7. A method of manufacturing a package, the method comprising:
   embedding one or more electronic components in one or more cavities formed in a carrier structure, wherein the carrier structure comprises:
      a back-side layer;
      a polymer profile formed on top of the back-side layer that comprises two or more polymer layers and the one or more cavities; and
      a front-side metallization layer on top of the polymer profile; and
   forming an intermediate cover layer comprising a polymer or a dielectric material, on top of the carrier structure and the one or more embedded electronic components, wherein intermediate connection terminals are provided in the intermediate cover layer for connection to the front-side metallization layer of the carrier structure and/or to one or more front-side terminals of the one or more electronic components;
   forming an intermediate cover layer comprising a polymer or a dielectric material, on top of the carrier structure and the one or more embedded electronic components, wherein intermediate connection terminals are provided in the intermediate cover layer for connection to the front-side metallization layer of the carrier structure and/or to one or more front-side terminals of the one or more electronic components;
   forming a signaling metallization layer in predetermined areas on top of the intermediate cover layer, wherein the signaling metallization layer connects to at least one front-side terminal of the one or more electronic components through at least one intermediate connection terminal;
   forming a top cover layer comprising a polymer or a dielectric material, on top of the intermediate cover layer and the signaling metallization layer, respectively, wherein top connection terminals are provided in the top cover layer for connection to predetermined intermediate connection terminals; and
   forming a top metallization layer in predetermined areas on top of the top cover layer connecting through the top connection terminals and predetermined intermediate connection terminals to one or more front-side terminals of one or more predetermined electronic components and/or to the front-side metallization layer of the carrier structure.

* * * * *